(12) United States Patent
Arimoto et al.

(10) Patent No.: US 7,465,980 B2
(45) Date of Patent: Dec. 16, 2008

(54) FERROELECTRIC MEMORY, MULTIVALENT DATA RECORDING METHOD AND MULTIVALENT DATA READING METHOD

(75) Inventors: Yoshihiro Arimoto, Kawasaki (JP); Hiroshi Ishihara, Tokyo (JP); Tetsuro Tamura, Kawasaki (JP); Hiromasa Hoko, Kawasaki (JP); Koji Aizawa, Tokyo (JP); Yoshiaki Tabuchi, Tokyo (JP); Masaomi Yamaguchi, Kawasaki (JP); Yasuo Nara, Kawasaki (JP); Kazuhiro Takahashi, Tokyo (JP); Satoshi Hasegawa, Kanagawa (JP)

(73) Assignees: Fujitsu Limited, Kawasaki (JP); Tokyo Institute of Technology, Tokyo (JP)

( * ) Notice: Subject to any disclaimer, the term of this patent is extended or adjusted under 35 U.S.C. 154(b) by 40 days.

(21) Appl. No.: 11/220,902

(22) Filed: Sep. 8, 2005

(65) Prior Publication Data

US 2006/0081901 A1    Apr. 20, 2006

(30) Foreign Application Priority Data

Sep. 10, 2004   (JP)   ............................. 2004-263639
Aug. 31, 2005   (JP)   ............................. 2005-252504

(51) Int. Cl.
*H01L 29/76*   (2006.01)
(52) U.S. Cl. ................ 257/295; 257/310; 257/E27.104
(58) Field of Classification Search ................ 257/295, 257/310, E27.085, E27.104; 365/145
See application file for complete search history.

(56) References Cited

U.S. PATENT DOCUMENTS

| 6,396,093 | B1 | 5/2002 | Nakamura | ................... | 257/295 |
| 6,714,435 | B1* | 3/2004 | Dimmler et al. | ............ | 365/145 |
| 7,008,833 | B2* | 3/2006 | Li et al. | ...................... | 438/197 |

FOREIGN PATENT DOCUMENTS

| JP | 05-152578 | 6/1993 |
| JP | 07-122661 | 5/1995 |
| JP | 08-124378 | 5/1996 |
| JP | 08-181289 | 7/1996 |
| JP | 11-040759 | 2/1999 |
| JP | 2000-040378 | 2/2000 |
| JP | 2000-243090 | 9/2000 |
| JP | 2001-094065 | 4/2001 |
| JP | 2001-267515 | 9/2001 |
| JP | 2002-269973 | 9/2002 |
| JP | 2002-329847 | 11/2002 |
| JP | 2002-353420 | 12/2002 |

(Continued)

OTHER PUBLICATIONS

Taiwanese Office Action dated Feb. 26, 2008.

*Primary Examiner*—Matthew E Warren
(74) *Attorney, Agent, or Firm*—Kratz, Quintos & Hanson, LLP

(57) ABSTRACT

A ferroelectric memory device includes a gate electrode formed on a semiconductor body via a ferroelectric film, first and second diffusion regions being formed in the semiconductor body at respective sides of a channel region, wherein the ferroelectric film comprises a first region located in the vicinity of the first diffusion region, a second region located in the vicinity of the second diffusion region, and a third region located between the first and second regions, wherein the first, second and third regions carry respective, mutually independent polarizations.

11 Claims, 16 Drawing Sheets

FOREIGN PATENT DOCUMENTS

| | | |
|---|---|---|
| JP | 2003-273333 | 9/2003 |
| JP | 2003-288783 | 10/2003 |
| JP | 2004-047593 | 2/2004 |
| TW | 456043 | 9/2001 |
| TW | 485618 | 5/2002 |
| WO | WO95/26570 | 10/1995 |

\* cited by examiner

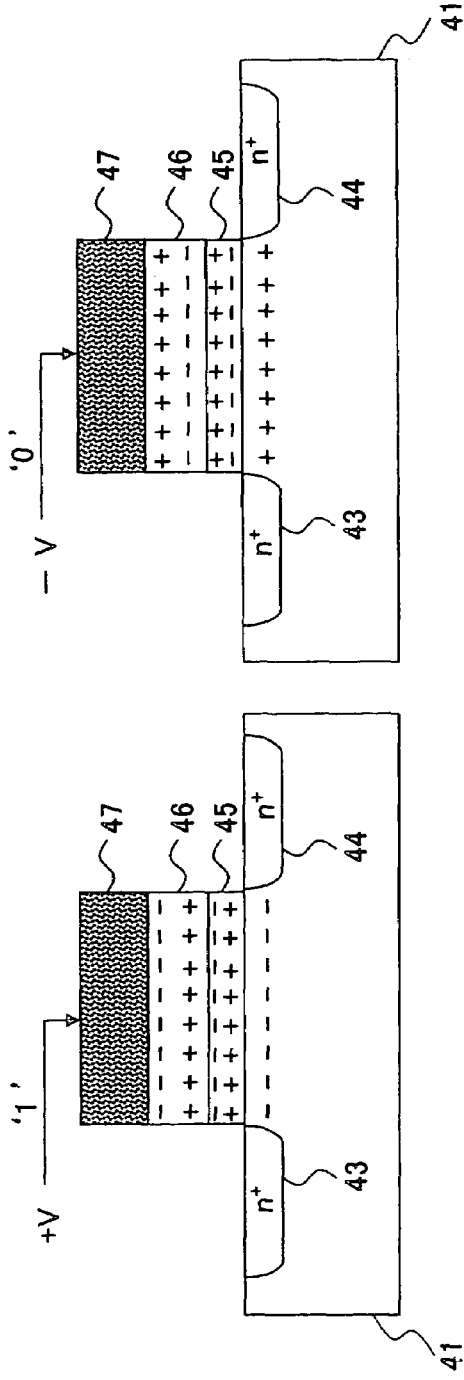
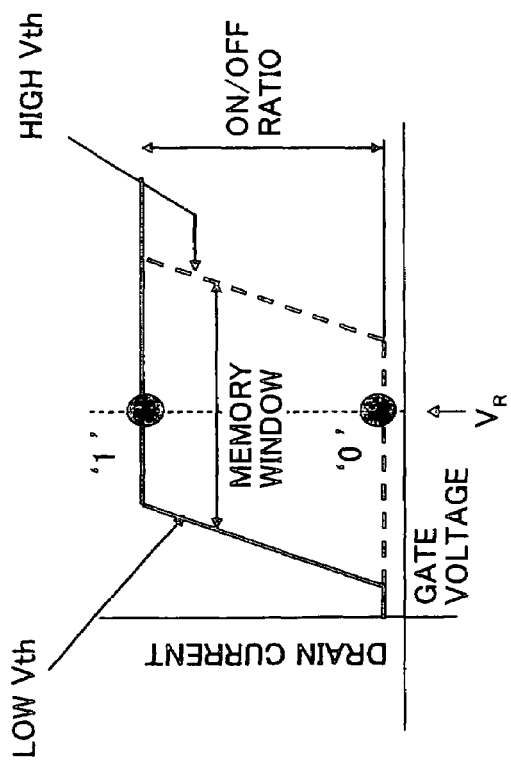

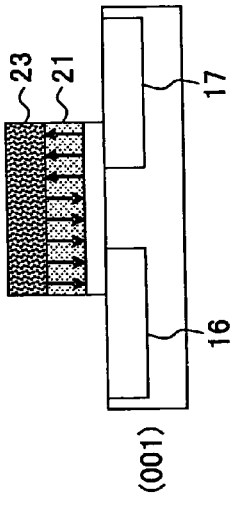
FIG.4A (000)
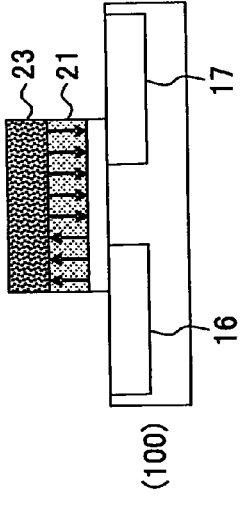
FIG. 4B (111)
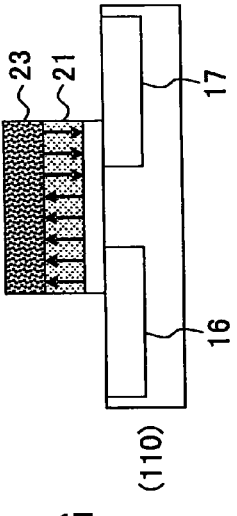
FIG.4C (010)
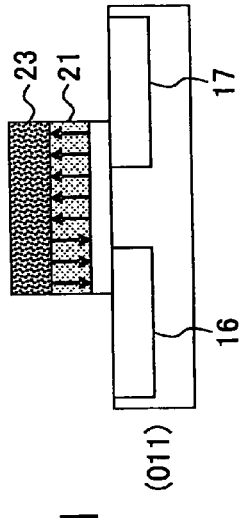
FIG.4D (101)
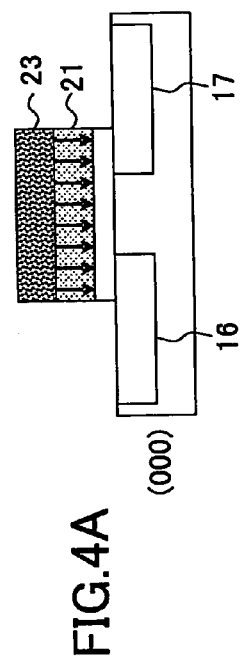
FIG.4E (001)
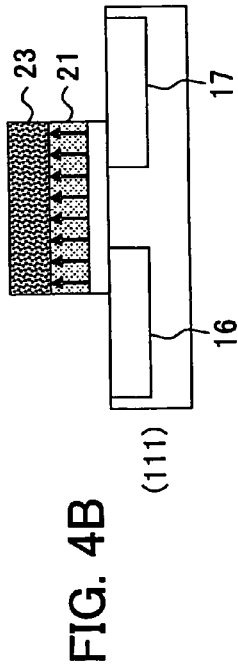
FIG.4F (100)
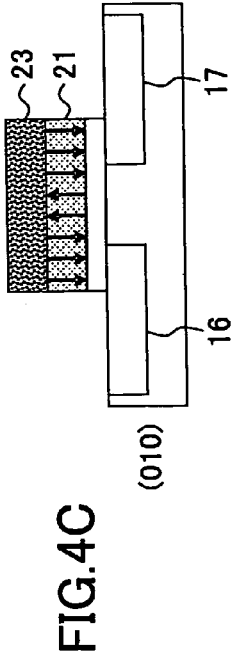
FIG.4G (110)
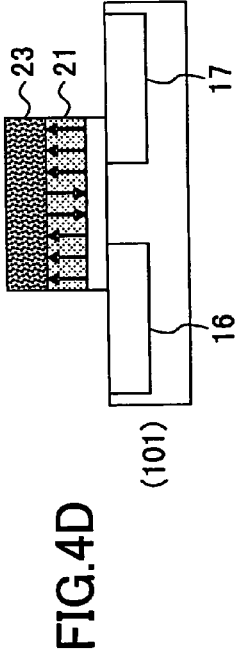
FIG.4H (011)

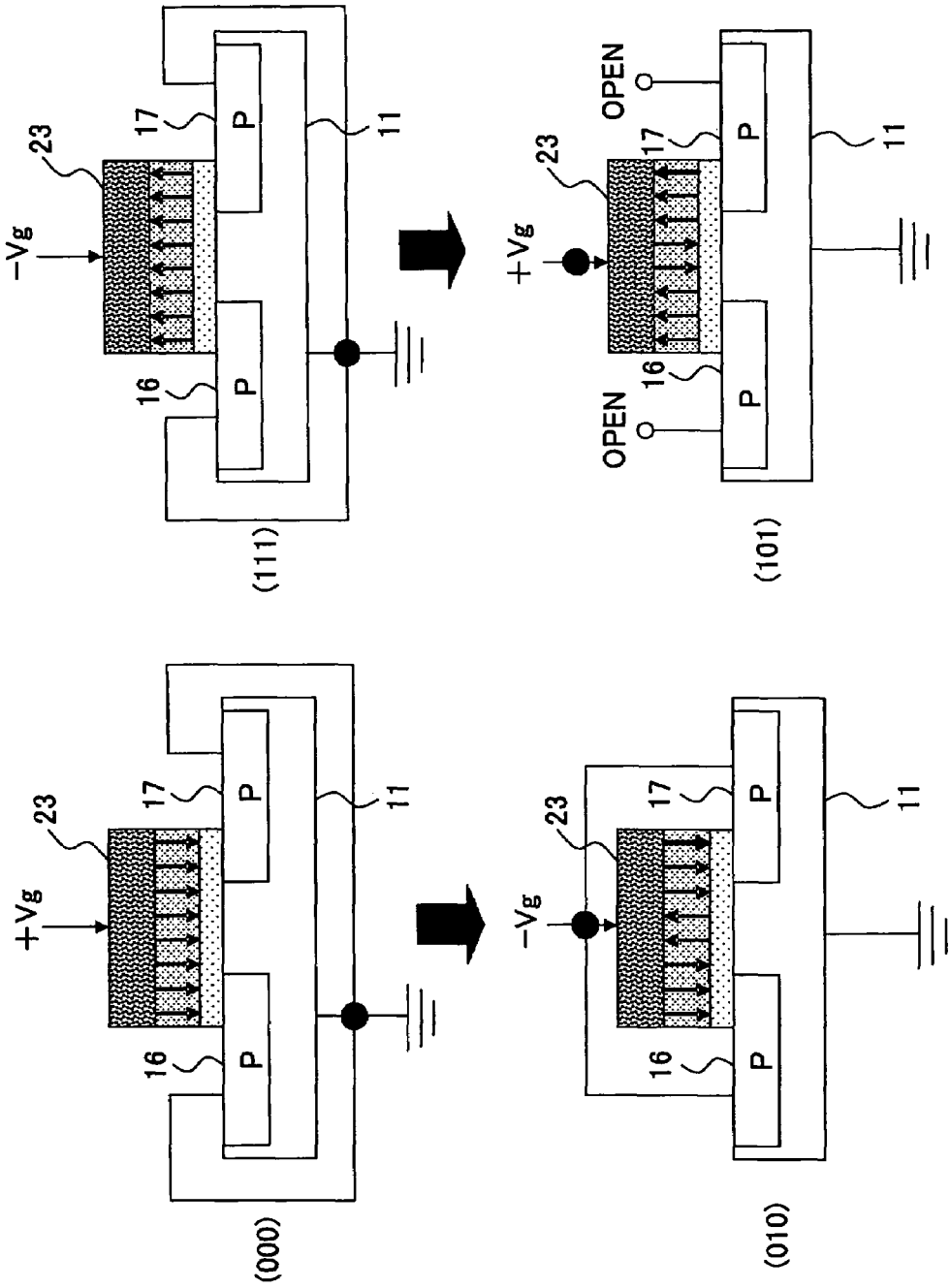

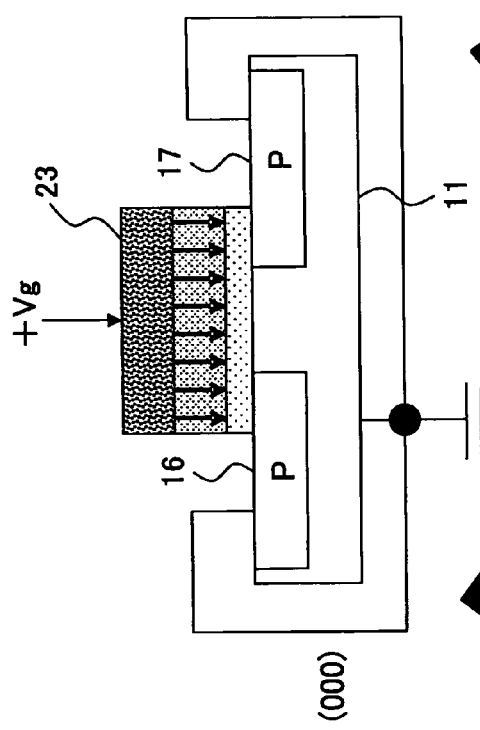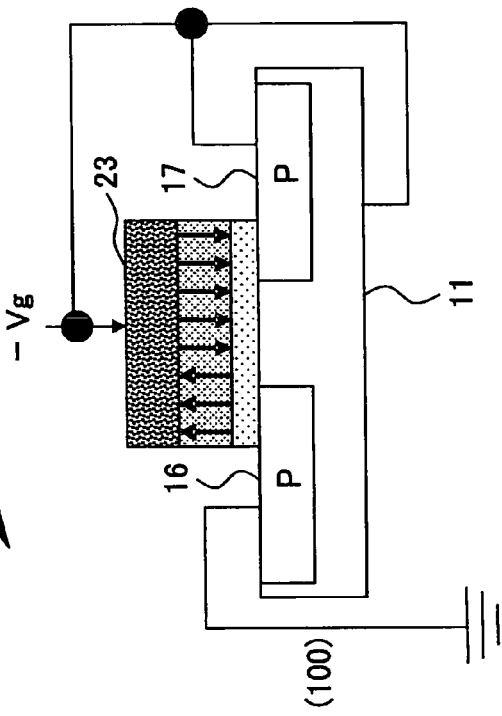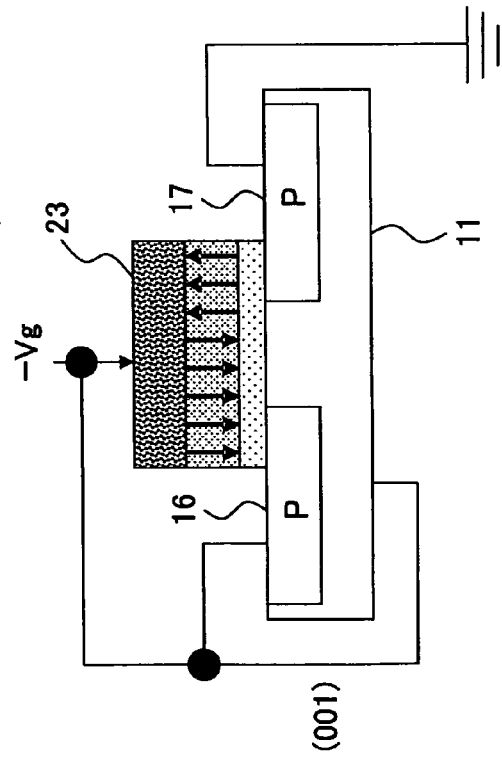
FIG.7A
FIG.7B

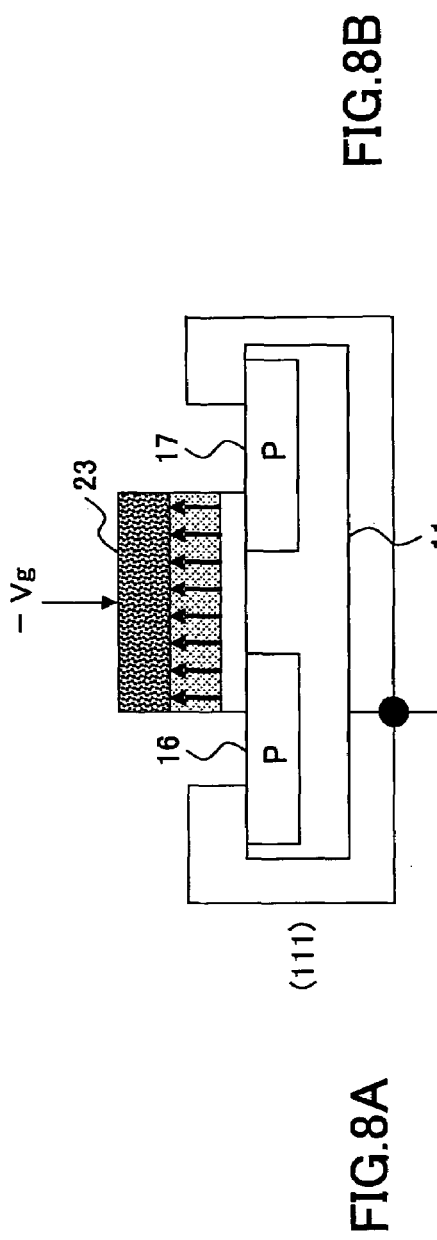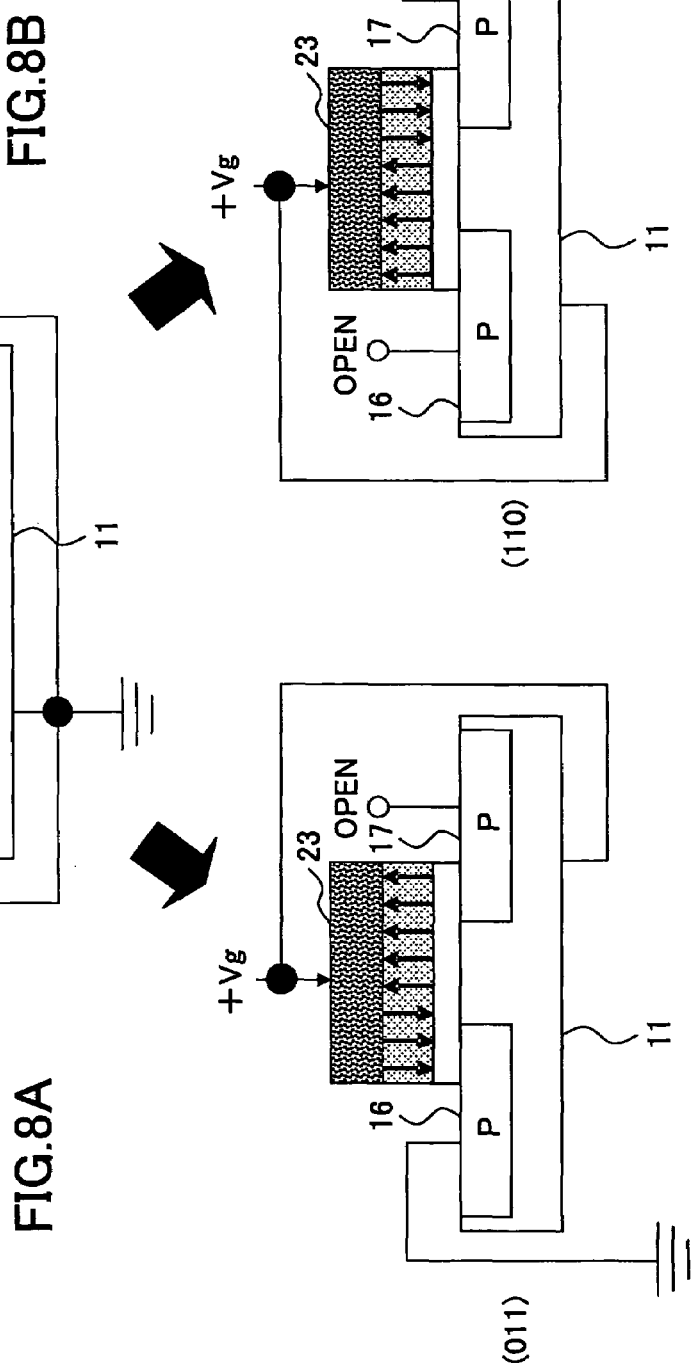
FIG.8A
FIG.8B

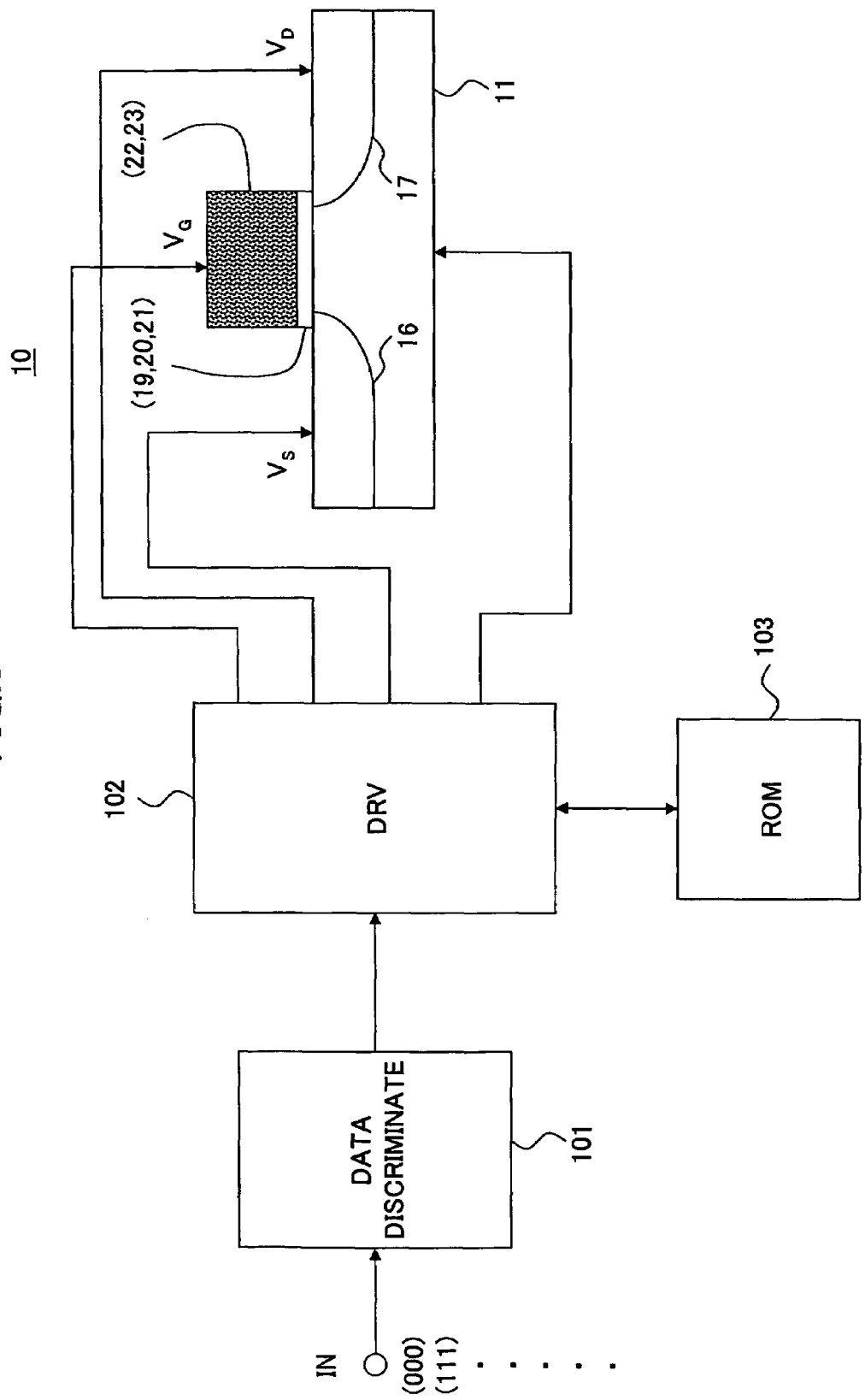

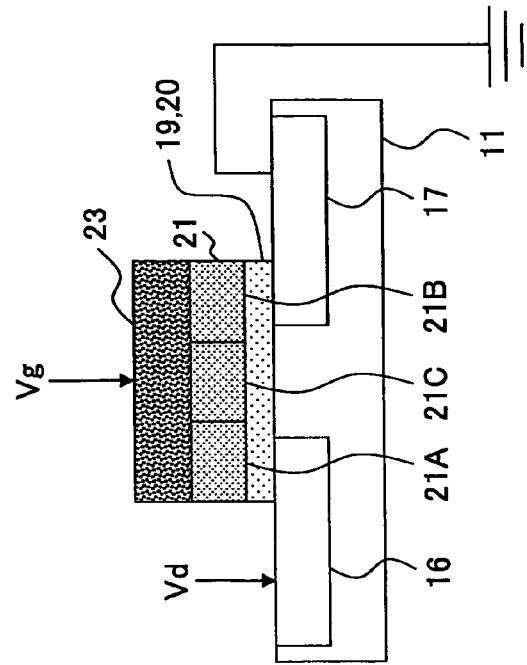
FIG.10A
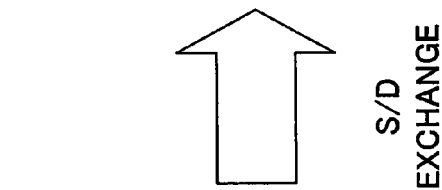
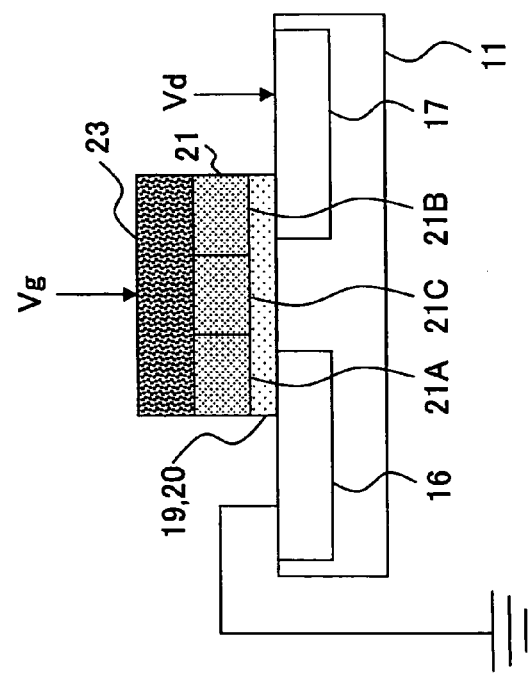
FIG.10B

U.S. 7,465,980 B2

FERROELECTRIC MEMORY, MULTIVALENT DATA RECORDING METHOD AND MULTIVALENT DATA READING METHOD

CROSS-REFERENCE TO RELATED APPLICATION

The present application is based on Japanese priority applications No.2004-263639 and No.2005-252504 respectively filed on Sep. 10, 2004 and Aug. 31, 2005, the entire contents of which are hereby incorporated by reference.

BACKGROUND OF THE INVENTION

The present invention generally relates to ferroelectric memory devices, and more particularly to a ferroelectric memory device of so-called MFS (metal-ferroelectric-semiconductor) type or MFIS (metal-ferroelectric-insulation-semiconductor) type, in which a ferroelectric film is provided on a channel region of a memory cell transistor in the state that a gate electrode of the memory cell transistor is provided on the ferroelectric film. Further, the present invention relates to fabrication process and driving method of such a ferroelectric memory device.

In various portable electronic apparatuses including cellular phones, further improvement of performance has become difficult nowadays because of various problems such as limitations imposed on the continual running time of the apparatus due to insufficient battery capacity, limitations imposed on the clock frequency, limitations imposed on the memory capacity, and the like.

Because of this, attempts are being made to reduce the electric power consumption of such an electronic apparatus by increasing the capacity of the power supply by way of using fuel cells or by introducing power management architecture. Nevertheless, performance of portable electronic apparatuses is still very much inferior to the electronic apparatuses operated with AC power supply. It is now recognized that mere improvement of power supply or power management should be insufficient for increasing the performance of portable electronic apparatuses to the degree comparable to the electronic apparatuses operated with AC power supply.

On the other hand, with electronic apparatuses that operates with an AC power supply, there is a problem that data is lost when the power is shut down, and thus, it has been necessary to store the data in a hard disk device or flash memory device, while such a procedure requires time for starting up and shutdown of the system, resulting in poor operability and increases electric power consumption. Particularly, when unexpected power failure is caused with electronic apparatuses operating with an AC power supply, there is caused a major damage of vanishing of data.

Such problems of vanishing of data with power shutdown, or the problem of needing long time for starting up or shutting down an electron apparatus, arise from the fact that conventional electronic apparatuses have used DRAMs or SRAMs, which are volatile in nature, for the semiconductor random access memory devices. Thus, investigations are being made for decreasing the time needed for starting up or shutting down an electronic apparatus, decreasing the electric power consumption in a standby state, and providing protection to vanishing of data, by using a non-volatile semiconductor memory for the main memory of electronic apparatuses.

While there are various semiconductor non-volatile memory devices, a ferroelectric memory (FeRAM) is thought as being the most promising device at the present juncture, in view of its capability of performing reading and writing operations at high speed. FeRAM is already used with IC cards and other applications.

However, currently available ferroelectric memory devices have the memory capacity of only 1M bits or less at the present moment, and the use of a ferroelectric memory as the main memory of portable electronic apparatuses or personal computers has not been achieved yet. Thus, increase of capacity of ferroelectric memory devices is an urgent issue in both portable electronic devices and electronic devices operated with AC power supply.

Under such circumstances, intensive efforts are being made for developing a single-transistor FeRAM having the feature of small memory area and large memory capacitance, wherein a single-transistor FeRAM is a ferroelectric memory device that provides a ferroelectric film in a gate electrode of a MOS transistor and holds information in the form of polarization of the ferroelectric film. At the time of reading, the device utilizes the change of threshold characteristics caused by the polarization of the ferroelectric film.

FIG. 1 shows the construction of a single-transistor FeRAM 40 of MFIS structure. With regard to the single-transistor FeRAM, reference should be made to Patent Reference 1 through Patent Reference 3.

Referring to FIG. 1, the FeRAM 40 is formed on an n-type silicon substrate 41 having a device region 41A defined by a device isolation film 42, wherein a channel region is formed in the device region 41A between a p-type source region 43 and a p-type drain region 44. Further, a ferroelectric film 46 of PZT, or the like, is formed on the channel region via a buffer insulation film 45 of $HfO_2$, or the like, and a gate electrode 47 of Pt, for example, is formed further thereon.

With such a ferroelectric memory device 40, data is written into the ferroelectric film 46 in the form of polarization as shown in FIGS. 2A and 2B, while this is made by applying a positive or negative writing voltage to the gate electrode 47. At the time of reading, existence of the electric charges induced in the channel region by the polarization of the ferroelectric film 46 is detected in the form of change of the drain current as shown in FIG. 2C. Thus, with the ferroelectric memory 40, data is read out by reading the polarization of ferroelectric film 4.

For example, the hysteresis curve shown in FIG. 2C with continuous line corresponds to the state of FIG. 2A, wherein a large drain current is obtained when a read gate voltage $V_R$ is applied to a gate electrode 47 in the state of FIG. 2A. On the other hand, the hysteresis curve shown in FIG. 2C with a broken line corresponds to the state of FIG. 2B, wherein it will be noted that a small drain current is obtained when the read voltage $V_R$ is applied to the gate electrode 47.

In FIG. 2C, the area defined by the hysteresis curve of low threshold state and the hysteresis curve of high threshold state is called "memory window". The larger the memory window, the more stable reading becomes possible. Further, the ratio of the drain current between the low threshold state and the high threshold state is called ON/OFF ratio. The larger the ON/OFF ratio, the more stable reading becomes possible.

It should be noted that the history of such a single-transistor FeRAM is very old and can be traced back up to 1957 (Reference should be made to Patent Reference 4).

REFERENCES

Patent Reference 1 Japanese Laid-Open Patent Application 2002-353420 official gazette Patent Reference 2 Japanese Laid-Open Patent Application 2002-329847 official gazette Patent Reference 3 Japanese Laid-Open Patent Application 2003-273333 official gazette Patent Reference 4 U.S. Pat. No. 2,791,760

Patent Reference 5 Japanese Laid-Open Patent Application 08-181289 official gazette Patent Reference 6 U.S. Pat. No. 6,608,339

Patent Reference 7 Japanese Laid-Open Patent Application 2000-243090 official gazette Patent Reference 8 Japanese Laid-Open Patent Application 2001-94065 official gazette Patent Reference 9 Japanese Laid Open Patent Application 2001-267515 official gazette Patent Reference 10 Japanese Laid-Open Patent Application 2002-269973 official gazette Patent Reference 11 Japanese Laid-Open Patent Application 2003-288783 official gazette Patent Reference 12 Japanese Laid-Open Patent Application 2004-47593 official gazette Patent Reference 13 Japanese Laid-Open Patent Application 5-152578 official gazette Patent Reference 14 Japanese Laid-Open Patent Application 7-122661 official gazette Patent Reference 15 Japanese Laid-Open Patent Application 8-124378 official gazette Patent Reference 16 WO95/26,570 international disclosure official gazette Patent Reference 17 Japanese Laid-Open Patent Application 11-40759 official gazette Patent Reference 18 Japanese Laid-Open Patent Application 2000-40378 official gazette Patent Reference 19 Japanese Laid-Open Patent Application 2000-243090 official gazette

SUMMARY OF THE INVENTION

Thus, a single-transistor FeRAM has been expected for long time as a promising device for a large-capacity high speed non-volatile semiconductor memory device, while conventional single-transistor FeRAMs have suffered from the problem of short data retention time, which is about one month in the longest, and thus, increase of data retention time has been the largest issue in the art of single-transistor FeRAM.

Meanwhile, in an FeRAM, polarization of the ferroelectric film occurs in each of the crystal grains. Thereby, it has been thought that local control of polarization should not be possible with such a ferroelectric film. Because of this, the issue of multivalent recording has not been studied at all in the art of ferroelectric memory devices.

Further, with spread use of non-volatile memory devices, it has now been recognized that data retention time of 10 years is not the indispensable requirement for a FeRAM. It is hardly conceivable that a personal computer or a digital home electric apparatus is left for 10 years without being turned on.

Thus, with ferroelectric memory devices of single-transistor FeRAM, it is believed that increase of memory capacitance becomes more urgent issue than extension of data retention time.

According to an aspect present invention, there is provided a ferroelectric memory device, comprising:

a semiconductor body including therein a channel region of a first conductivity type;

a gate electrode formed on said semiconductor body in correspondence to said channel region in said semiconductor body via a ferroelectric film;

first and second diffusion regions of second conductivity type formed in said semiconductor body at respective lateral sides of said channel region, said ferroelectric film comprising: a first region located in the vicinity of said first diffusion region; a second region located in the vicinity of said second diffusion region; and a third region located between said first and second regions, said first, second and third regions carrying respective, mutually independent polarizations.

According to another aspect, the present invention provides a multivalent data recording method of a ferroelectric memory device, said ferroelectric memory device comprising: a gate electrode formed on a semiconductor body including therein a channel region of a first conductivity type via a ferroelectric film such that said gate electrode is located on said semiconductor body in correspondence to said channel region therein; and first and second diffusion regions of a second conductivity type formed in said semiconductor body at respective lateral sides of said channel region, said ferroelectric film comprising: a first region located in the vicinity of said first diffusion region; a second region located in the vicinity of said second diffusion region; and a third region located between said first and second regions, said recording method comprising the step of inducing polarization in said first through third regions independently.

Here, the step of inducing polarization may comprise any of the steps of: (1) applying a writing voltage of a first polarity to said gate electrode and grounding said first and second diffusion regions and said semiconductor body; (2) applying a writing voltage of a second polarity to said gate electrode and grounding said first and second diffusion regions and said semiconductor body; (3) applying, after said step (1), said writing voltage of said second polarity to said gate electrode, said first and second diffusion regions and grounding said semiconductor body; (4) applying, after said step (2), said writing voltage of said first polarity to said gate electrode, floating said first and second diffusion regions, and grounding said semiconductor body; (5) applying, after said step (1), said writing voltage of said second polarity to said gate electrode, said first diffusion region and said semiconductor body and grounding said second diffusion region; (6) applying, after said step (1), said writing voltage of said second polarity to said gate electrode, said second diffusion region and said semiconductor body and grounding said first diffusion region; (7) applying, after said step (2), said writing voltage of said first polarity to said gate electrode and said semiconductor body, grounding said first diffusion region, and floating said second diffusion region; and (8) applying, after said step (2), said writing voltage of said first polarity to said gate electrode and said semiconductor body, floating said first the diffusion region and grounding said second diffusion region.

In another aspect, the present invention provides a reading method of multivalent data from a ferroelectric memory, said ferroelectric memory device comprising: a gate electrode formed on a semiconductor body including therein a channel region of a first conductivity type via a ferroelectric film such that said gate electrode is located on said semiconductor body in correspondence to said channel region therein; and first and second diffusion regions of a second conductivity type formed in said semiconductor body at respective lateral sides of said channel region, said ferroelectric film comprising: a first region located in the vicinity of said first diffusion region; a second region located in the vicinity of said second diffusion region; and a third region located between said first and second regions, said reading method comprising: a first reading step of detecting a first drain current by applying a reading voltage to said gate electrode and applying a first read drain voltage to said first diffusion region; a second reading step, conducted after said first reading step, of detecting a second drain current by applying said reading voltage to said gate electrode and applying a second read drain voltage to said second the diffusion region; and obtaining a combination of polarization caused in said first, second and third regions from a combination of said first and second drain currents.

According to the present invention, multivalent recording of information becomes possible with a ferroelectric memory device, by recording information to first through third regions of the ferroelectric film in the form of mutually independent polarizations. Thereby, it become possible to increase the memory capacity of the ferroelectric memory significantly.

Further, with such a ferroelectric memory device, it becomes possible to read out the multivalent information written into the first through third regions, by applying a predetermined read drain voltage to one of the diffusion regions and then to the other of the diffusion regions of the ferroelectric memory at the time of data reading.

Further, according to the present invention, an amorphous insulation film containing $HfO_2$ as the principal component, such as an $HfO_2$ film, an $HfSiOx$ film, an $HfAlOx$ film, or an $HfSiON$ film, is deposited on a semiconductor body containing Si as a primary constituent element, and a thermal oxidation processing is applied thereafter in an oxidizing ambient. Thereby, there is formed an amorphous film of primarily silicon oxide such as an $SiO_2$ film at the interface to the semiconductor body, at the time of converting the amorphous insulation film to a polycrystal film. As a result of formation of such an amorphous film of primarily silicon oxide, the quality of crystal is improved for the high dielectric film interposed between the semiconductor body and ferroelectric film in the FeRAM of MFIS type. As a result, excellent polarization characteristics are achieved at low voltage and data retention characteristics is stabilized. Further, the film quality of the ferroelectric film is improved with formation of such an amorphous interface film. Further, by introducing a conductive oxide such as $IrO_2$, $RuO_2$, or $SrRuO_3$ to a part of the gate electrode, it becomes possible to improve the polarization characteristic in terms of the drive voltage and fatigue of the ferroelectric film further.

As a result of increase of film quality of the ferroelectric film, stable polarization characteristic is achieved even at low voltages, and there occurs no problem even when the film thickness of the insulation film is increased to some extent. With this, occurrence of carrier injection or leakage current is suppressed, and the problem of shifting of the memory window is reduced. As a result, retention of data over long time becomes possible with the present invention, and it becomes possible to achieve reading and writing of data with stability.

Other objects and further features of the present invention will become apparent from the following detailed description when read in conjunction with the attached drawings.

BRIEF DESCRIPTION OF THE DRAWINGS

FIGS. 2A-2C are diagrams explaining the operational principle of the FeRAM of FIG. 1;

FIGS. 4A and 4H are diagrams showing the outline of multivalent recording in the FeRAM of the first embodiment of the present invention;

FIGS. 6A and 6B are further diagrams showing examples of multivalent recording in the FeRAM of the first embodiment of the present invention;

FIGS. 7A and 7B are further diagrams showing further examples of multivalent recording in the FeRAM according to the first embodiment of the present invention;

FIGS. 8A and 8B are further diagrams showing further examples of multivalent recording in the FeRAM according to the first embodiment of the present invention;

FIG. 9 is a diagram showing the construction of a multivalent data record circuit used with the FeRAM of the first embodiment of the present invention;

FIGS. 10A and 10B are diagrams showing reading of multivalent data from the FeRAM of the first embodiment of the present invention;

DETAILED DESCRIPTION OF THE INVENTION

First Embodiment

Figure 1:
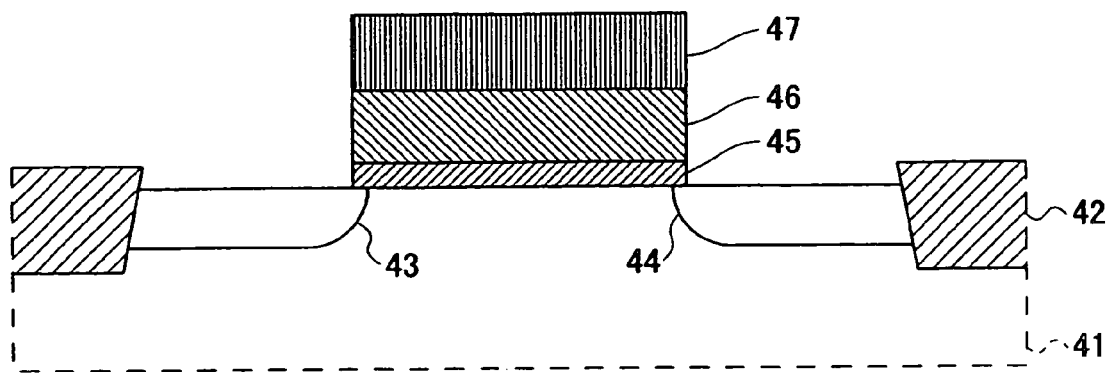
FIG. 1 is a diagram showing the construction of an FeRAM of conventional MFIS structure.
Figure 3B:
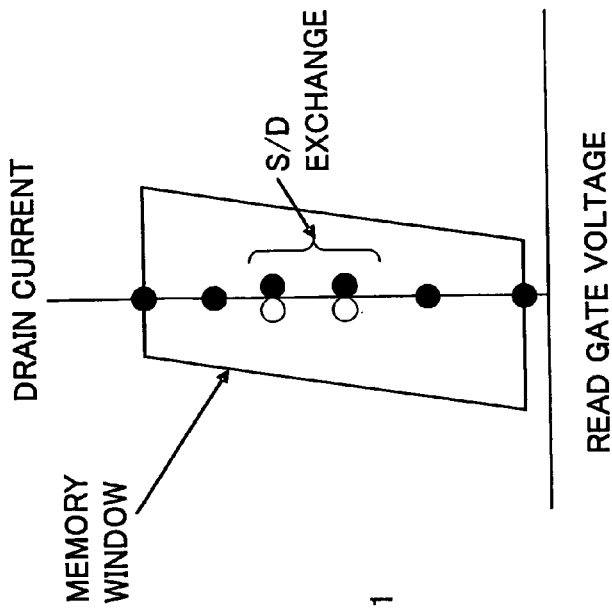
FIGS. 3A and 3B are diagrams showing the construction and operation of an FeRAM according to a first embodiment of the present invention.
Figure 3A:
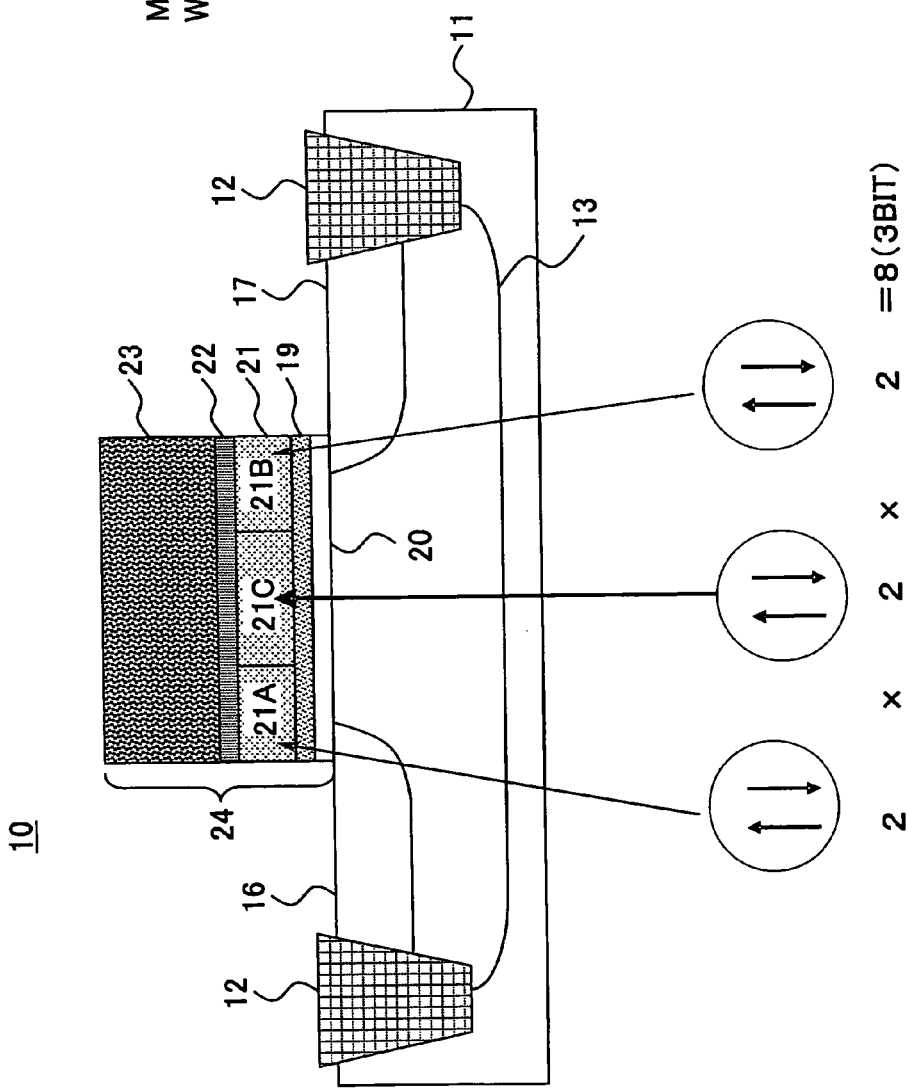

FIG. 3A shows the construction of the memory cell of an FeRAM 10 of MFS type according to a first embodiment of the present invention.

Referring to FIG. 3A, there is defined a device region on the silicon substrate 11 by a device isolation structure 12 of STI (shallow trench isolation) type, and an n-type well 13 is formed in the silicon substrate 11 in correspondence to the device region.

Further, there is formed a gate structure 24 on the silicon substrate 11 in correspondence to a channel region to be formed in the device region 13, and p-type diffusion regions 16 and 17 are formed in the device region 13 at respective lateral sides of the gate structure 24. Thus, a p-channel MOS transistor is formed in the memory cell as a memory cell transistor.

The gate structure 24 includes an insulation film of stacked structure in which a silicon oxide film 20 formed on the silicon substrate 11 and an $HfO_2$ film 19 are laminated, and a BNT (($Bi,Nd)_4Ti_3O_{12}$) film 21 is formed on the insulation film as a ferroelectric film. Further, a gate electrode 23 of Pt is formed on the BNT film 21 via a conductive oxide film 22 of SRO ($SrRuO_3$).

With the present invention, crystal quality of the ferroelectric film 21 is improved together with the ferroelectricity, by forming an $HfO_2$ film 19 under the ferroelectric film 21. Further, by interposing an SRO film 22 between the ferroelectric film 21 and the gate electrode 23, desorption of oxygen from the ferroelectric film 21 to the metal gate electrode 23 is suppressed, and diffusion of metallic element from the ferroelectric film 21 to the metal gate electrode 23 is suppressed at the same time. As a result, the FeRAM 10 can be driven at low drive voltage, and fatigue of the ferroelectric film 21 is reduced also.

Further, by interposing an amorphous silicon oxide film 20 between the $HfO_2$ film 19 and the silicon substrate 11 with the film thickness of preferably 2-5 nm, trapping of carriers in the gate insulation film of the silicon oxide film 20 and the $HfO_2$ film 19 is reduced, and irregular fluctuation of threshold voltage, such as shifting of the memory window, is successfully avoided for the MOS transistor that forms the FeRAM. Further, by interposing such an amorphous film free from grain boundary between the silicon substrate 11 and the polycrystal $HfO_2$ film 19, it becomes possible to suppress the gate leakage current.

In the present invention, the ferroelectric film 21 is not limited to BNT but any of PZT $(Pb(Zr,Ti)O_3)$, SBT $(SrBi_2Ta_2O_9)$, BLT $((Bi,La)_4Ti_3O_{12})$, PGO $(Pb_5Ge_3O_{11})$, and the like, can be used. Further, the polycrystal insulation film 19 is not limited to $HfO_2$ of stoichiometric composition, but it is also possible to use a metal oxide of non-stoichiometric composition such as HfOx, HfSiOx, HfAlOx, or alternatively, a metal oxynitride such as HfSiON. Further, the conductive oxide film 22 is not limited to SRO but it is also possible to use $IrO_2$, $RuO_2$, or the like.

In FeRAM 10 of FIG. 3A, information is held in the ferroelectric film 21 in the form of polarization, wherein, in the FeRAM of the present embodiment, the ferroelectric film 21 is formed with a first region 21A in the vicinity of the diffusion region 16, a second region 21B in the vicinity of the diffusion region 17 and a region 21C between the first region 21A and the second region 21B. Thereby, polarizations are induced in these regions independently to each other.

FIG. 4A-4H show the examples of polarization caused in such ferroelectric regions 21A-21C.

Referring to the drawings, in the state of FIG. 4A, a downward polarization corresponding to data "0" is induced in all of the regions 21A-21C, and thus, this state will be designated as (000).

In the state of FIG. 4B, on the other hand, an upward polarization corresponding to data "1" is induced in all of the regions 21A-21C, and this state will be designated as (111).

Similarly, in the state of FIG. 4C, the downward polarization is induced in the regions 21A and 21B and the upward polarization is induced in the region 21C. Thus, this state will be designated as (010).

In the state of FIG. 4D, the upward polarization is induced in the regions 21A and 21B and the downward polarization is induced in the region 21C. Thus, this state will be designated as (101).

In the state of FIG. 4E, the regions 21A and 21C are induced with the downward polarization, while the upward polarization is induced in the region 21B. Thus, this state will be designated as (001).

In the state of FIG. 4F, the region 21A is induced with the upward polarization while the downward polarization is induced in the regions 21B and 21C. Thus, this state will be designated as (100).

In the state of FIG. 4G, the regions 21A and 21C are induced with the upward polarization, while the downward polarization is induced in the region 21B. Thus, this state will be designated as (110).

Further, in the state of FIG. 4H, the region 21A is induced with the downward polarization, while the upward polarization is induced in the regions 21B and 21C. Thus, this state will be designated as (011).

Like this, it is possible to hold the 3-bit information taking eight different values in a single memory cell with the FeRAM 10 of the construction of FIG. 3A.

As a result of such multivalent recording, the threshold characteristics of the p-channel MOS transistor constituting the memory cell cause a change in corresponding to the multivalent data written to the ferroelectric film 21 as shown in FIG. 3B, and it becomes possible to read out such multivalent data by detecting the change of such threshold as will be explained later.

Next, writing of multivalent data to the

FeRAM 10 of FIG. 3A will be explained.

Figure 5A:
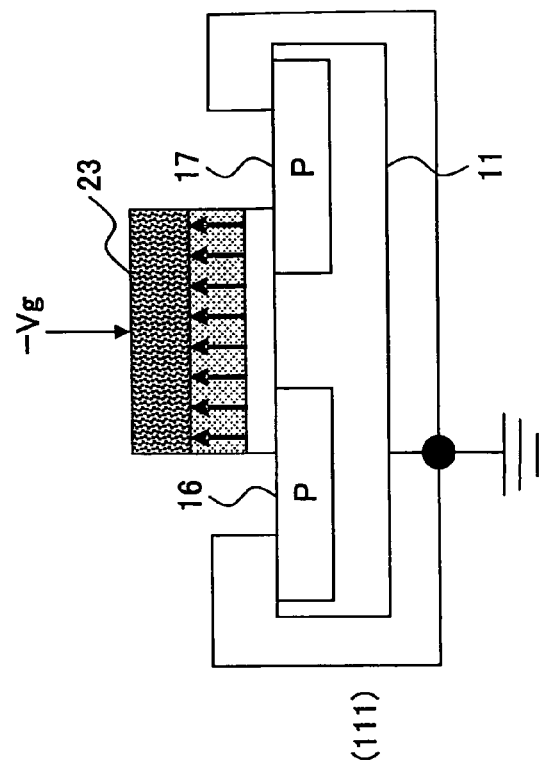
FIGS. 5A and 5B are diagrams showing an example of multivalent recording in the FeRAM of the first embodiment of the present invention.

FIG. 5A shows the case of writing the data (000).

Referring to FIG. 5A, a positive writing voltage +Vg is applied to the gate electrode 23, and the p-type diffusion regions 16 and 17 and the silicon substrate 11 are all grounded at the same time. With this, the downward polarization is induced in all of the regions 21A-21C of the ferroelectric film 21 in correspondence to the state of FIG. 4A.

Figure 5B:
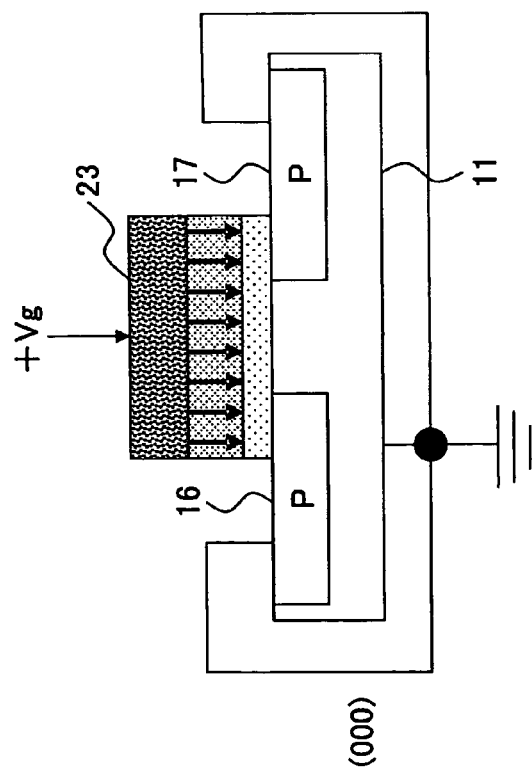

FIG. 5B shows case of writing the data (111).

Referring to FIG. 5B, a negative writing voltage −Vg is applied to the gate electrode 23, and the p-type diffusion regions 16 and 17 and the silicon substrate 11 are all grounded at the same time. With this, the upward polarization is induced in all of the regions 21A-21C of the ferroelectric film 21 in correspondence to the state of the FIG. 4B.

FIG. 6A shows case of writing the data (010).

Referring to FIG. 6(A), the data (000) is written at first according to the process of FIG. 5A, and next, the negative writing voltage −Vg is applied to the gate electrode 23 and the diffusion regions 16 and 17 while grounding the silicon substrate 11. With this, the region 21C of the ferroelectric film 21 causes reversal of polarization, and as a result, the state of (010) of FIG. 4C is realized.

FIG. 6B shows case of writing the data (101).

Referring to FIG. 6B, the data (111) is written at first according to the process of FIG. 5B, and next, the positive writing voltage +Vg is applied to the gate electrode 23 while grounding the silicon substrate 11 and floating the diffusion regions 16 and 17. With this, the region 21C of the ferroelectric film 21 causes reversal of polarization, and as a result, the state of (101) of FIG. 4D is realized.

FIG. 7A shows case of writing the data (001).

Referring to FIG. 7A, the data (000) is written at first according to the process of FIG. 5A, and next, the diffusion region 17 is grounded and the negative writing voltage is applied to the gate electrode 23, the diffusion region 16 and the silicon substrate 11 at the same time. With this, the region 21B causes reversal of polarization and the state of (001) of FIG. 4E is realized.

FIG. 7B shows case of writing the data (100).

Referring to FIG. 7B, the data (000) is written at first according to the process of FIG. 5A, and next, the diffusion region 16 is grounded and the negative writing is applied to the gate electrode 23, the diffusion region 17 and the silicon substrate 11. With this, the region 21A causes reversal of polarization and the state of (001) of FIG. 4E is realized.

Table 1 summarizes the writing operation of FIGS. 5A and 5B, FIGS. 6A and 6B, and FIGS. 7A and 7B.

TABLE 1

| | 1st | | | | 2nd | | | |
|---|---|---|---|---|---|---|---|---|
| | $V_G$ | $V_S$ | $V_D$ | $V_{sub}$ | $V_G$ | $V_S$ | $V_D$ | $V_{sub}$ |
| (000) | Plus | G | G | G | Plus | G | G | G |
| (111) | Minus | G | G | G | Minus | G | G | G |
| (010) | Plus | G | G | G | Minus | Minus | Minus | G |
| (101) | Minus | G | G | G | Plus | Open | Open | G |
| (001) | Plus | G | G | G | Minus | Minus | G | Minus |
| (100) | Plus | G | G | G | Minus | G | Minus | Minus |
| (011) | Minus | G | G | G | Plus | G | Open | Plus |
| (110) | Minus | G | G | G | Plus | Open | G | Plus |

Plus: positive writing voltage
Minus: negative writing voltage

In Table 1, $V_G$ represents the gate voltage applied to the gate electrode 23, $V_S$ represents the source voltage applied to the diffusion region 16, $V_D$ is a drain voltage applied to the diffusion region 17, and $V_{sub}$ represents the substrate voltage applied to the silicon substrate 11.

It should be noted that the above operation of Table 1 for the case in which the memory cell transistor is formed of a p-channel MOS transistor. In the case of an N-channel MOS transistor, the writing operation is achieved according to Table 2 below. Because this writing operation easily understood from the above explanation, further explanation thereof will be omitted.

TABLE 2

| | 1st | | | | 2nd | | | |
|---|---|---|---|---|---|---|---|---|
| | $V_G$ | $V_S$ | $V_D$ | $V_{sub}$ | $V_G$ | $V_S$ | $V_D$ | $V_{sub}$ |
| (000) | Plus | G | G | G | Plus | G | G | G |
| (111) | Minus | G | G | G | Minus | G | G | G |
| (010) | Plus | G | G | G | Minus | Open | Open | G |
| (101) | Minus | G | G | G | Plus | Plus | Plus | G |
| (001) | Plus | G | G | G | Minus | Open | G | Minus |
| (100) | Plus | G | G | G | Minus | G | Open | Minus |
| (011) | Minus | G | G | G | Plus | G | Plus | Plus |
| (110) | Minus | G | G | G | Plus | Plus | G | Plus |

Plus: positive writing voltage
Minus: negative writing voltage

FIG. 9 shows the outline of the circuit construction used for carrying out the writing operation of Table 1 or Table 2 with the FeRAM 10.

Referring to FIG. 9, the writing data is first subjected to a discrimination process for discriminating the octavalent value thereof in relation to the foregoing 3-bit data in a data discrimination circuit 101, and the result of discrimination is provided to a driver circuit 102.

The driver circuit 102 refers to a ROM 103 holding therein Table 1 above in the case the FeRAM 10 is formed of a p-channel MOS transistor or Table 2 in the case the FeRAM 10 is formed of an n-channel MOS transistor, and applies the gate voltage $V_G$, the source voltage $V_S$, the drain voltage $V_D$ and the substrate voltage $V_{sub}$ to the FeRAM 10 according to Table 1 or Table 2.

Next, reading of the multivalent data from the FeRAM 10 will be explained with reference to FIGS. 10A and 10B.

In the present invention, the polarization information written into the ferroelectric film 21 is read out by applying a reading voltage Vg to the gate electrode 23 at the time of reading and by measuring the drain current Vd, wherein a two-step reading procedure shown in FIGS. 10A and 10B is used for reading out the multivalent information.

Referring to FIG. 10A, a reading voltage Vg is applied to the gate electrode 23 in the first step, and a first drain current of the FeRAM 10 is detected by grounding the diffusion region 16 and applying a read drain voltage $V_d$ to the diffusion region 17.

Next, in the second step of FIG. 10B, the reading voltage Vg is applied to the gate electrode 23 and a second drain current of the FeRAM 10 is detected by grounding the diffusion region 17 and applying the read drain voltage $V_d$ to the diffusion region 16.

Further, the multivalent data written into the FeRAM 10 is read out from the combination of the first and second drain currents in accordance with Table 3 below.

TABLE 3

| Drain current 1 | Drain current 2 | Multivalent data |
|---|---|---|
| Large | Large | (000) |
| Small | Small | (111) |
| Mid-small | Mid-small | (010) |
| Mid-Large | Mid-Large | (101) |
| Mid-Large | Mid-small | (001) |
| Mid-small | Mid-Large | (100) |
| Small | Mid-small | (110) |
| Mid-small | Small | (011) |

Thus, when the data (000) is written into the ferroelectric film 21, both of the first drain current (Drain current 1) and the second drain current (Drain current 2) take a large value (Large), while this indicates that the written data is (000).

On the other hand, in the case the data (111) is written into the ferroelectric film 21, both of the first drain current and the second drain current take a small value (Small), while this indicates that the written data is (000).

Also, in the case the data (010) is written into the ferroelectric film 21, both of the first drain current and the second drain current take an intermediate value (Mid-small), which is smaller than a mid value of the large value and the small value, while this indicates that the written data is (010).

Further, in the case the data (101) is written into the ferroelectric film 21, both of the first drain current and the second drain current take an intermediate value (Mid-large), which is larger than a mid value of the large value and small value, while this indicates that the written data is (101).

In the case the data (001) is written into the ferroelectric film 21, the first drain current takes "Mid-large" value, while the second drain current takes "Mid-small" value. From this, it is indicated that the written data is (001).

In the case the data (110) is written into the ferroelectric film 21, the first drain current takes the value "Small", while the second drain current takes the value "Mid-small". From this, it is indicated that the written data is (110).

Further, in the case that the data (011) is written into the ferroelectric film 21, the first drain current takes the value "Mid-small" while the second drain current shows the value "Small". From this, it is indicated that the written data is (011).

Figure 11:
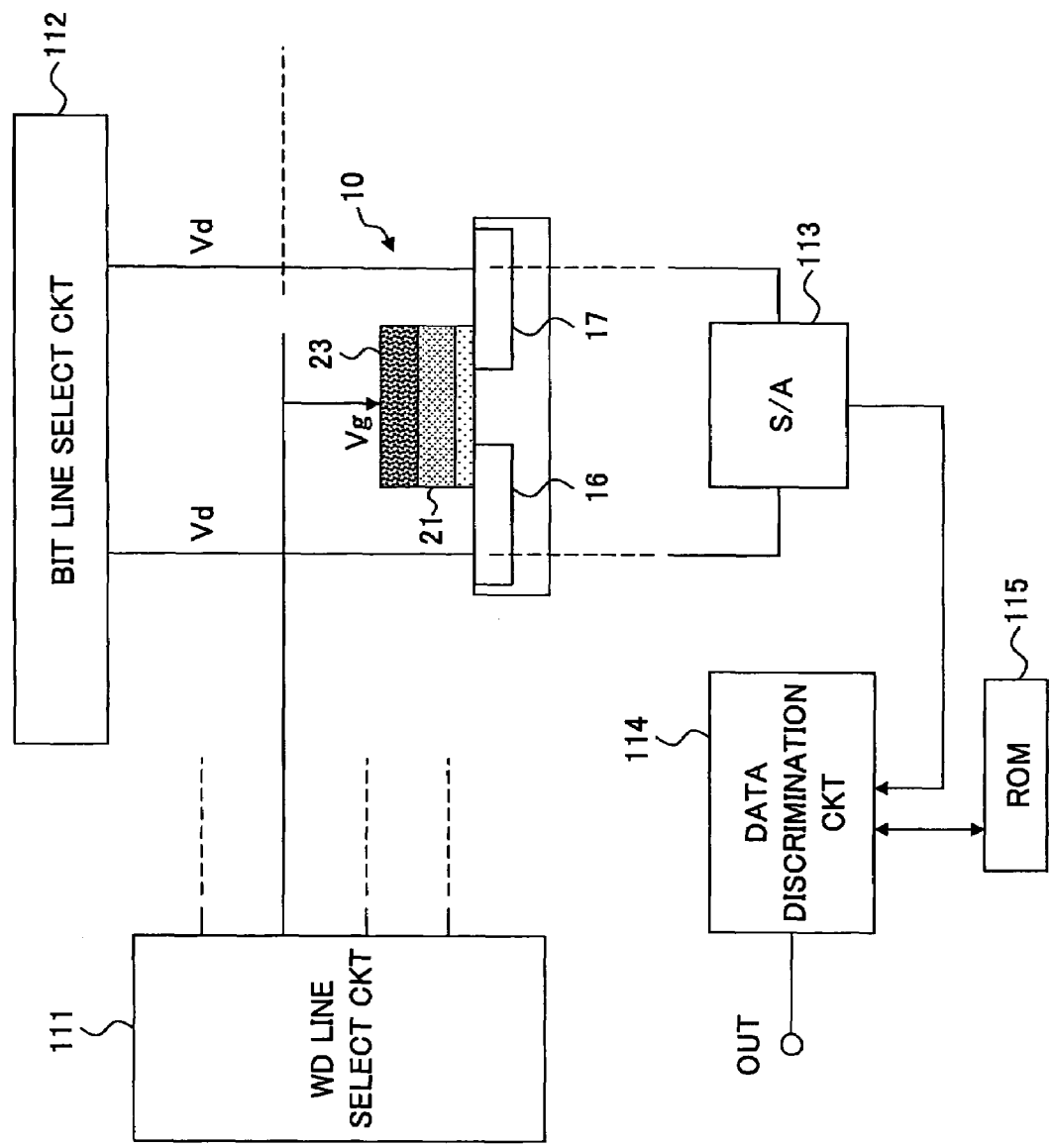
FIG. 11 is a diagram showing the construction of a multivalent data reading circuit used with the FeRAM of the 1st embodiment of the present invention.

FIG. 11 shows the outline of a reading circuit that reads out the multivalent data from the FeRAM 10 accordance to Table 3.

Referring to FIG. 11, the read gate voltage Vg is supplied to the gate electrode 23 of the FeRAM 10 from a word line selection circuit 111, and the read drain voltage $V_d$ is applied to the first diffusion region 16 from the bit line selection circuit 112. Next, the read drain voltage $V_d$ is applied to the diffusion region 17, and the drain current is detected by a sense amplifier 113 each time.

Further, the result of detection of the sense amplifier 113 is provided to a data judgment circuit 114, while the data judgment circuit 114 determines the multivalent data thus read out with reference to a ROM 115 that holds Table 3. Further, result of determination is provided to an output terminal.

Figure 12:
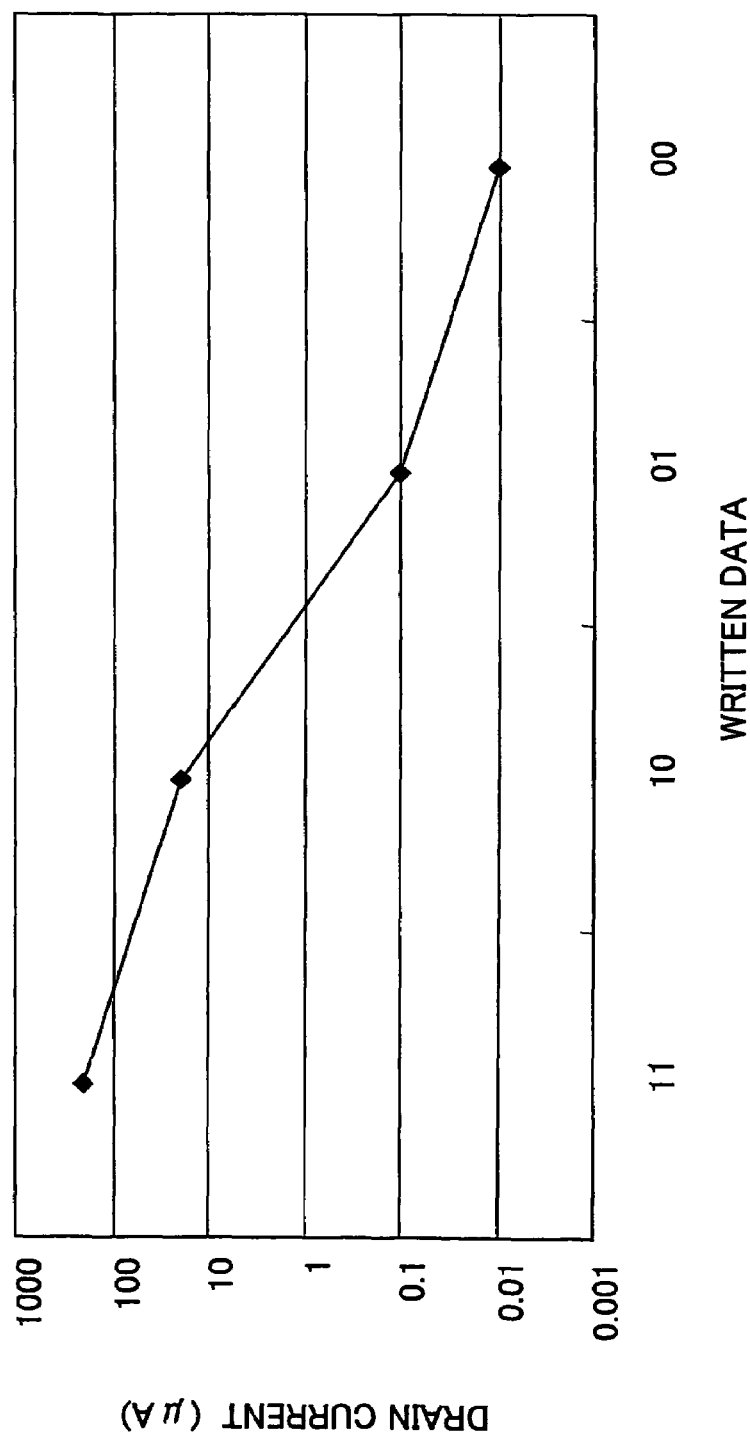
FIG. 12 is a diagram showing an example of reading of multivalent data from the FeRAM of the first embodiment of the present invention.

FIG. 12 shows examples of the multivalent data thus read out from the FeRAM.

It should be noted that the multivalent data read out in the example of FIG. 12 is 2-bit data taking divalent values, wherein it can be seen that there occurs clear change of drain current in correspondence to the divalent values (11), (10), (01) and (00) of the data written into the ferroelectric film 21, while this demonstrates that writing and reading of such multivalent data is in fact possible. In the experiment of FIG. 11, the writing voltage $V_G$ was sets to 8V, the read gate voltage Vg was set to 0.3V, and the read drain voltage $V_d$ was set to 0.1V.

In the writing/reading experiment of FIG. 12, there is only one asymmetric polarization, and thus, there is no need of exchanging the source and drain regions and comparing the drain current at the time of reading for determining the location of polarization as explained with reference to Table 3, and determination of data is achieved similarly to the conventional method of detecting the drain current once.

In the case data writing is achieved by inducing plural asymmetric polarizations, data reading can be conducted by exchanging the source and drain regions and comparing the drain current values thus detected.

The details of fabrication process of the FeRAM 10 used with the experiment will be explained with reference to other embodiments.

Thus, with the present invention, it becomes possible to achieve multivalent recording in an FeRAM of single-transistor type, and good prospect has been obtained for realizing large capacitance non-volatile memory, which has been difficult to achieve with conventional FeRAMs.

While the data retention time is less than one month at the present juncture, there are many cases in which such short retention time does not raise problems in actual use of FeRAMs, and thus, it becomes possible to utilize the FeRAM of the present invention as the main memory of an electronic apparatus such as a personal computer.

Further, while extrapolation of trend does not always guarantee the correct result, it is thought, from the extrapolation of this result, that data retention time exceeding 108 seconds (≈3 years) should be possible. Further, by way of further optimization of the insulation films 19 and 20, it should be possible to extend the data retention time up to 10 years.

Because of increase of data retention time, of FeRam10 extended in the present invention, the electric power consumption for data retention is reduced substantially with the FeRAM 10 of the present invention, and it becomes possible to increase the clock speed or memory capacity of portable electronic apparatuses, and long running time become possible with such portable electronic apparatuses. Further, with an electronic apparatus operated with AC power supply, a quick start becomes possible, and the handiness of the apparatus is improved substantially.

Further, while the present embodiment uses a silicon substrate for the semiconductor substrate 11, the substrate 11 may be any of a bulk silicon substrate or an epitaxial substrate, or a alternatively so-called SOI (silicon-on-insulator) substrate.

Further, the substrate 11 is not limited to Si, but a mixed crystal of Si with other group IV element such as SiGe may be used. In this case, the amorphous insulation film formed on the surface of the semiconductor substrate becomes a silicon oxidation film containing the group IV element such as Ge.

Further, while the first embodiment has been explained for the case in which the memory cell transistor is a p-channel style MOS transistor, the present invention is not limited to a p-channel FeRAM but is applicable to an n-channel FeRAM also.

Further, while the present embodiment explains for the case of single-transistor FeRAM in which a single transistor forms the memory cell, the gate structure and driving method of the present invention are applicable also to an FeRAM in which plural transistors such as two transistors form a single memory cell.

Further, the present invention is not limited to the FeRAM 10 of MFIS type shown in FIG. 3A but is effective also in the case of FeRAM of MFS in which the insulation films 19 and 20 are omitted.

Second Embodiment

Hereinafter, a second embodiment of the present invention will be explained.

In the present embodiment, the width of the pulse voltage applied to the gate electrode is controlled to be 1 µs or less, such as 100 ns, at the time of writing data into the FeRAM 10 of the first embodiment, for avoiding occurrence of substantial carrier injection to the interface between the polycrystalline $HfO_2$ film 19 and the $SiO_2$ film 20 and associated shift of the memory window in the direction of positive voltage or negative voltage along with the writing operation.

Further, with the present embodiment, reading of data is made before conducting writing at the time of writing data to such an FeRAM 10, and writing is suppressed in the case the data to be written is identical with the data already written. With this, carrier injection to the foregoing interface is minimized.

Further, in the case the data to be written is different from the data that is already written, reading is conducted after the writing and it is confirmed whether or not the writing is carried out normally. In the case it is determined that writing is not normal, the reading and writing operations are repeated.

Further, with the present embodiment, a writing pulse of reverse polarity is provided at the time of data writing before providing the writing data pulse. Thereby, in view of different magnitude of memory window shifting between the case of applying a negative voltage and the case of applying a positive voltage, the present embodiment changes at least one of the pulse voltage and pulse width of the reverse data writing pulse and the data writing pulse at the time of data writing so that the shifting of the memory window is suppressed.

Thus, in the case of writing data to the p-channel style FeRAM 10 with a negative writing pulse, the magnitude of shift of the memory window becomes larger as compared with the case of using a positive writing pulse, and because of this, the present embodiment increases the voltage of the positive pulse over the voltage of the negative pulse. In the case the positive voltage pulse has the voltage of 10V, for example, the voltage of the negative voltage pulse is set to −7V.

Alternatively, it is possible to use the same absolute values for the pulse and negative pulses and change the pulse width between the positive and negative pulses. For example, such shifting of the memory window at the time of data writing can be compensated for, by setting the pulse voltage to ±8V and by setting the positive pulse width to 600 ns and the negative pulse width to 80 ns.

Further, it is possible to change both of the pulse voltage and the pulse width.

Third Embodiment

Next, the fabrication process of the FERAM 10 of FIG. 3A will be explained as a third embodiment of the present invention. In the drawings, those parts explained previously are designated by the same reference numerals and the description thereof will be omitted.

Figure 13:
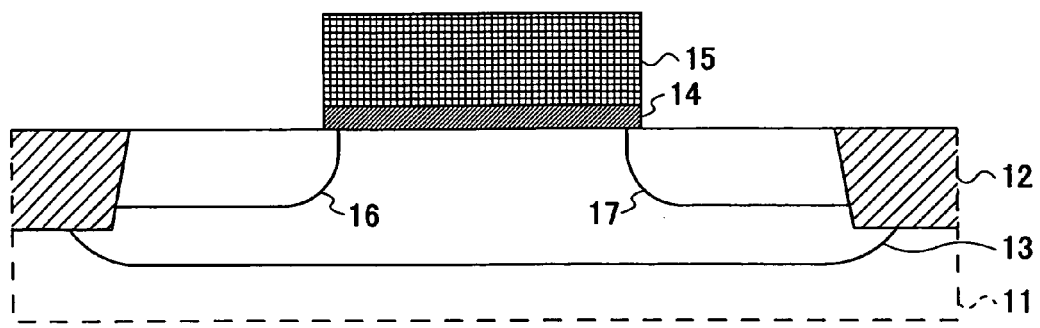
FIGS. 13-18 are diagrams showing the fabrication process of an FeRAM according to a third embodiment of the present invention.

Referring to FIG. 13, the present embodiment uses a p-type silicon substrate as the silicon substrate 12, and an STI device isolation structure 12 is formed on the silicon substrate 11 similarly to the fabrication process of conventional MOSFET.

Further, an n-type well 13 is formed in the silicon substrate 11 in correspondence to a device region defined by the device isolation structure 12, and a dummy gate oxide film 14 and a dummy gate electrode 15 of polysilicon are formed on the device region thus formed.

Further, a p-type impurity element is introduced into the device region 13 of the silicon substrate 11 by an ion implantation process while using the dummy gate electrode 15 as a mask, and with this, the p-type diffusion regions 16 and 17 are formed.

Figure 14:
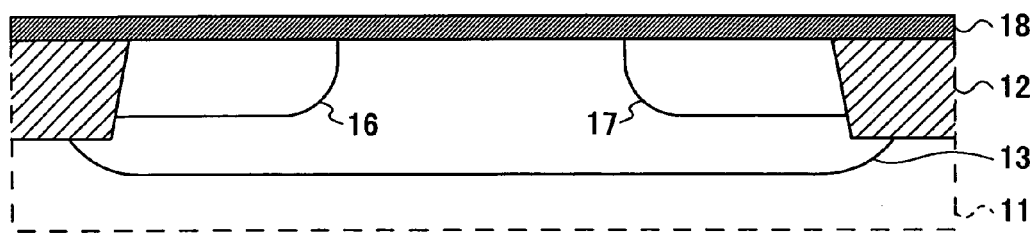

Next, in the step of FIG. 14, the dummy gate electrode 15 and the dummy gate 14 oxide film are removed, and an amorphous film 18 of $HfO_2$ is formed on the entire surface of the silicon substrate 11 with the thickness of 3-15 nm, preferably with the thickness of 5 nm, by an electron beam evaporation deposition process that uses an HfO$_2$ target.

Figure 15:
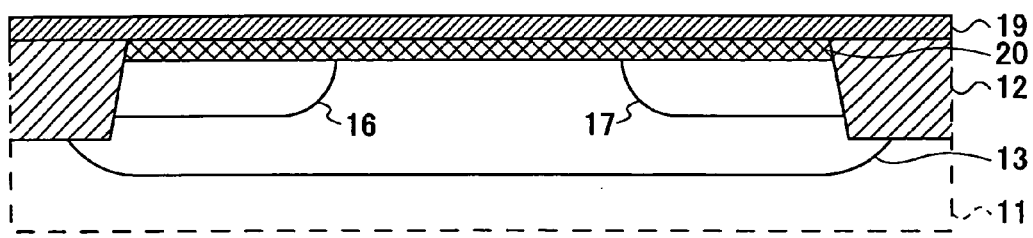

Next, in the step of FIG. 15, the silicon substrate 11 of the FIG. 14 is subjected to a heat treatment process for 1-10 minutes in an oxidizing ambient by an RTA (Rapid Thermal Annealing) process at the temperature of 750-850° C. Thereby, the amorphous HfO2 film 18 is converted to a polycrystalline $HfO_2$ film 19, and an $SiO_2$ film 20 of 2-5 nm in thickness is formed at the interface between the polycrystalline $HfO_2$ film 19 and the p-type silicon substrate 11.

Here, it should be noted that the polycrystalline $HfO_2$ film 19 may contain Si originating from the p-type silicon substrate 11 to some extent. Further, the $SiO_2$ film 20 is naturally in amorphous state. Thereby, the $HfO_2$ film may have a non-stoichiometric compositional ratio. Further, the polycrystal state is not essential for the $HfO_2$ film, and it is possible to form the $HfO_2$ film in amorphous state by optimizing the condition of the RTA process.

Figure 16:
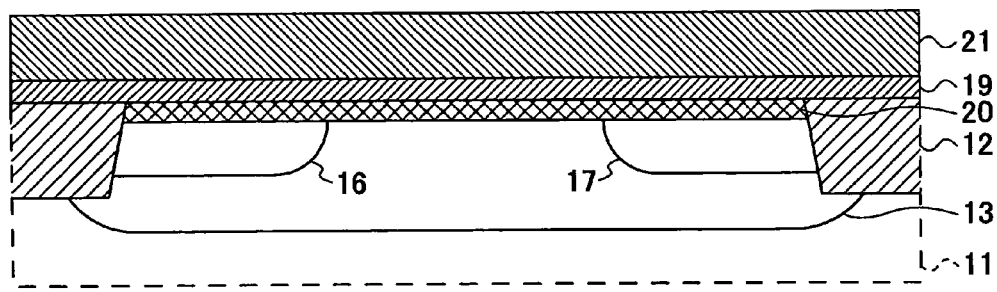

Next, in the step of FIG. 16, a ferroelectric film of BNT is formed on the polycrystalline $HfO_2$ film 19 by a sol-gel process with the thickness of 200-400 nm, and a thermal annealing process is conducted in oxygen ambient at the temperature of 700-800° C. for 30 minutes. With this, the BNT film undergoes crystallization and a polycrystal ferroelectric film 21 of perovskite structure is formed.

Figure 17:
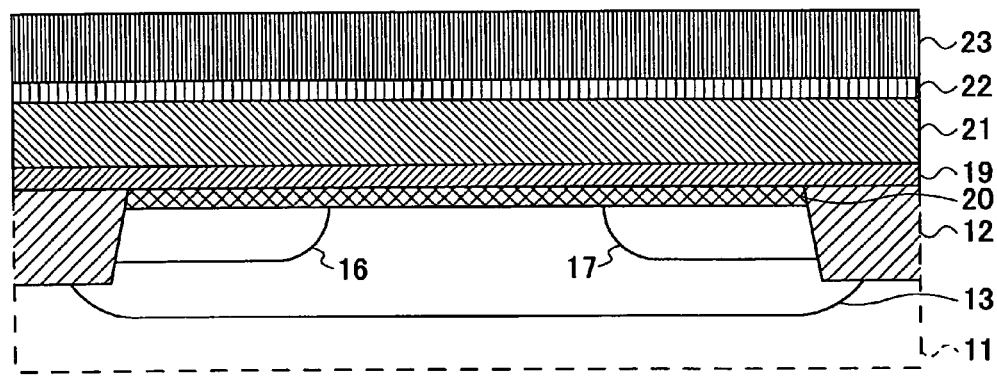

Next, in the step of FIG. 17, a conductive oxide film 22 of $SrRuO_3$, for example, is deposited on the ferroelectric film 21 with the thickness of 100 nm, and a Pt film 21 is deposited further thereon with the thickness of 150 nm.

Further, according to the needs, the structure thus obtained is applied with a thermal annealing process in oxidation ambient at the temperature of 700-800° C. for 30 minutes.

Figure 18:
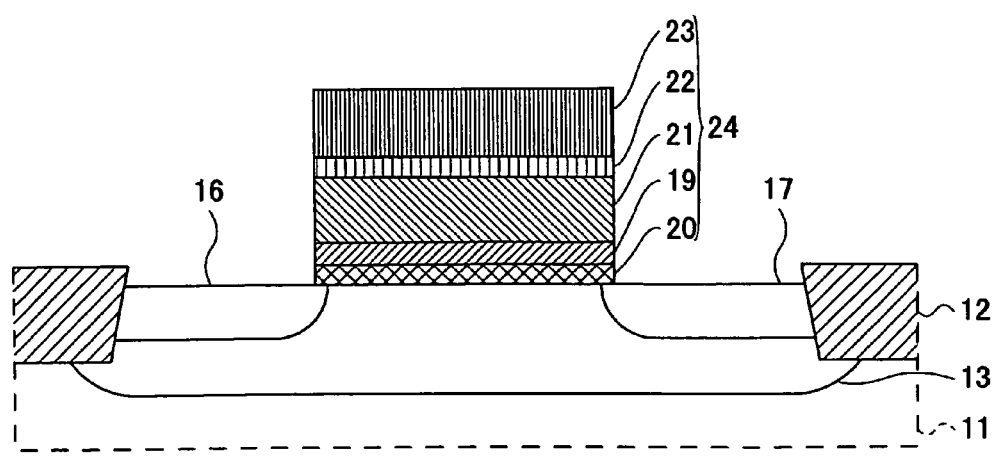

Next, in the step of FIG. 18, a laminated film structure of the foregoing films is subjected to a patterning process, and the gate structure 24 is formed as a result.

Further, while not illustrated, an interlayer insulation film is formed on the structure of FIG. 18 thus obtained, and contact holes are formed in correspondence to the p-type source region, the p-type drain region, and the Pt film. Further, the contact holes are filled with respective via-plugs.

Further, by forming the multilayer interconnection structure on the interlayer insulation film according to the needs, the fundamental structure of the single-transistor memory cell 10 of MFIS structure shown in FIG. 3A is completed.

Figure 19:
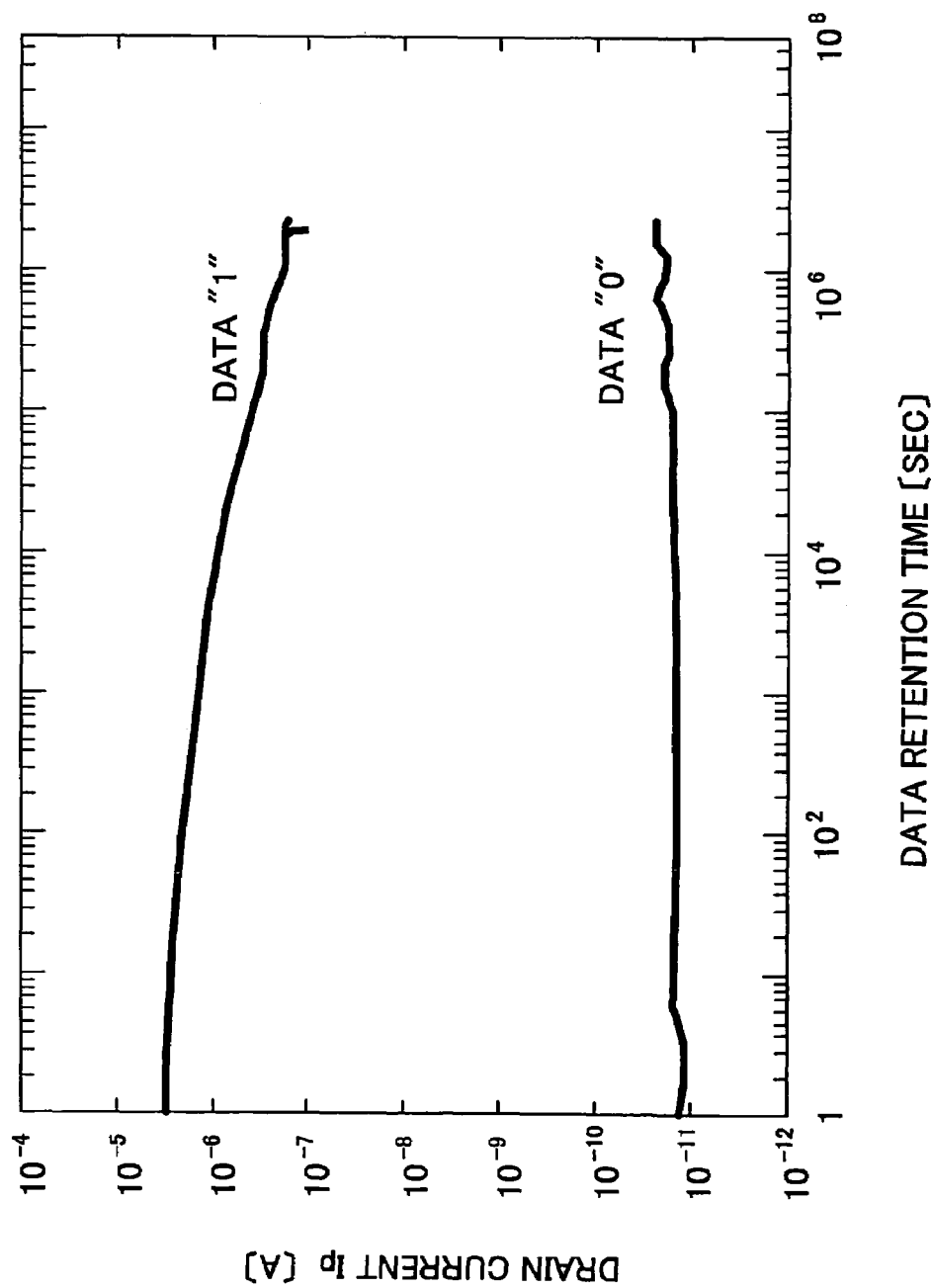
FIG. 19 is a diagram showing the data retention characteristics of the FeRAM fabricated according to the third embodiment of the present invention.

FIG. 19 shows the data retention time of the FeRAM 10 fabricated according to the present embodiment.

Referring to FIG. 19, the drain current ID of the memory cell written with the data "1" takes the value exceeding $10^{-7}$ A when a time of 30 days ($\approx 2.6 \times 10^6$ seconds) has elapsed, while in the memory cell written with the data "0", it can be seen that a drain current $I_D$ of less than $10^{-11}$ A is maintained after the duration of 30 days has elapsed. Thus, it is possible with the FeRAM fabricated with the process of the present embodiment to detect the difference between data "1" and data "0" even after 30 days have elapsed.

With the present embodiment, the $HfO_2$ film 18 is deposited in the step of FIG. 16 by an electrons beam evaporation deposition process, while it is also possible to use other film formation process for thus purpose such as metal-organic metal vapor phase deposition (MOCVD) process. In the case of forming the $HfO_2$ film 18 by an MOCVD process, it is possible to use a tetratertiarybutoxy hafnium as the source gas.

Further, with the present embodiment, it should be noted that the polycrystalline insulation film 19 is not limited to an HfO2 film but any high-K dielectric film that contains $HfO_2$ as a primary component. Thus, it is possible to use HfSiOx, HfAlOx, HfSiON, or the like, in place of the $HfO_2$ film.

Further, while the present invention forms the ferroelectric film 21 by sol-gel process, the present invention is by no means limited a sol-gel process, and it is also possible to use a sputtering process, MOCVD process, or metal-organic decomposition (MOD) process.

Further, while the present embodiment forms the ferroelectric film 21 by a BNT film, the ferroelectric film 21 is not limited to BNT, and it is possible to use any of PZT, BLT, SBT, BTO, PGO, or the like. Further, it is possible to dope the ferroelectric film with a very small amount of Nd, La, or the like.

Further, while the present embodiment provides the conductive oxide film 22 of SRO on the ferroelectric film 21, the conductive oxide film 22 is not limited to SRO and it is possible to use other conductive oxide such as $RuO_2$, $IrO_2$, and the like.

Further, while the present embodiment uses a silicon substrate as semiconductor substrate 11, it is possible to use any of a bulk silicon substrate, an epitaxial substrate and a so-called SOI substrate for the substrate 11.

Further, the semiconductor substrate 11 is not limited to silicon substrate with the present invention but it is possible to use a mixed crystal of Si with another group IV element, such as SiGe. In the case of using such a mixed crystal, the amorphous insulation film formed on the surface of the substrate becomes a silicon oxide film containing the additional group IV element such as Ge.

Fourth Embodiment

Figure 20:
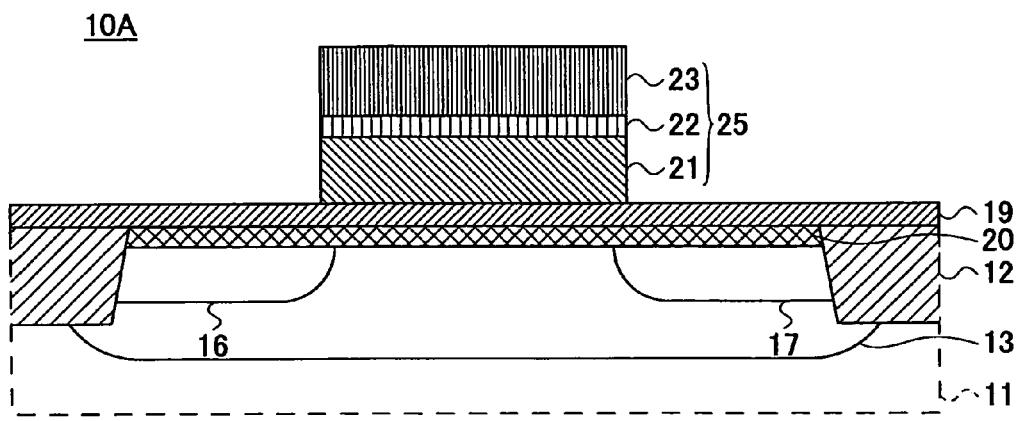
FIG. 20 is a diagram showing the construction of an FeRAM according to a fourth embodiment of the present invention.

FIG. 20 shows the construction of an FeRAM 10A according to a fourth embodiment of the present invention, wherein those parts of FIG. 20 explained previously are designated by the same reference numerals and the description thereof will be omitted.

Referring to FIG. 20, the present embodiment leaves the polycrystalline $HfO_2$ film 19 and the silicon oxide film 20 on the p-type source region 16 and the p-type drain region 17 at the time of patterning process of the FIG. 16.

According to the present embodiment, the patterning process of the gate structure 25 becomes easier by way of leaving the HfO$_2$ film, of which patterning is difficult to conduct.

Fifth Embodiment

Figure 21:
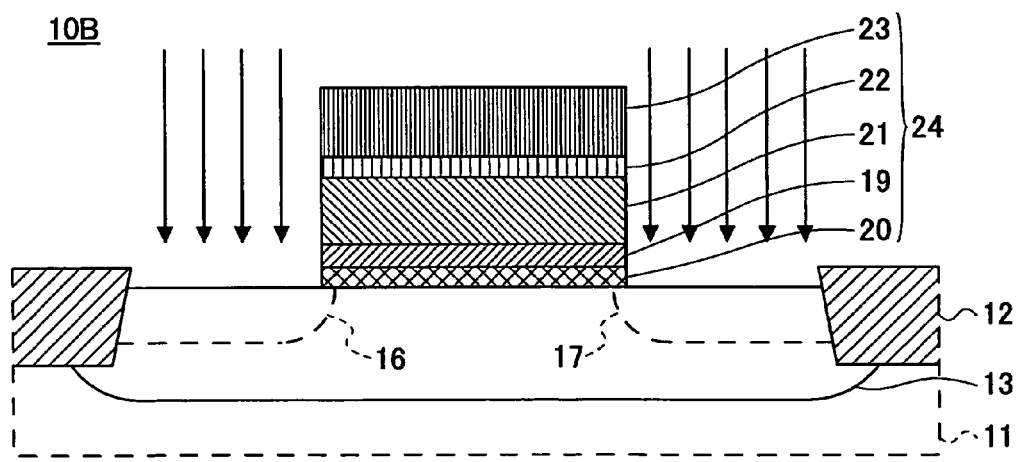
FIG. 21 is a diagram showing the construction of an FeRAM according to a fifth embodiment of the present invention.

FIG. 21 shows the construction of an FeRAM 10B according to a fifth embodiment of the present invention, wherein those parts of FIG. 21 explained previously are designated by the same reference numerals and the description thereof will be omitted.

Referring to FIG. 21, the present embodiment conducts the ion implantation process for forming the diffusion regions 16 and 17 after forming the gate structure 24 while using the gate structure 24 as a self-aligned mask instead of conducting the ion implantation process with the process of the FIG. 12.

According to the present embodiment, it is possible to reduce the parasitic capacitance caused by overlapping of the gate electrode with the diffusion regions 16 and 17 can be reduced.

Further, while the present invention has been described for preferable embodiments, the present invention is by no means limited to such particular embodiments and the various variations and modifications may be possible without departing from the scope of the invention.

What is claimed is:

1. A ferroelectric memory device, comprising:
a semiconductor body including a channel region of a first conductivity type;
a gate electrode formed on said semiconductor body in correspondence to said channel region in said semiconductor body via a ferroelectric film;
first and second diffusion regions of second conductivity type formed in said semiconductor body at respective lateral sides of said channel region,
said ferroelectric film comprising: a first ferroelectric region located in the vicinity of said first diffusion region; a second ferroelectric region located in the vicinity of said second diffusion region; and a third ferroelectric region located between said first and second regions,
said first, second and third regions carrying respective, mutually independent polarizations.

2. The ferroelectric memory device as claimed in claim 1, further comprising:
a driver circuit applying respective drive voltages to said gate electrode, said first and second diffusion regions and said semiconductor body and inducing respective polarizations in said first through third regions of said ferroelectric film; and
a data discrimination circuit supplied multivalent data and controlling said driver circuit in response to a value of said multivalent data,
said driver circuit carrying out: a first writing step that induces identical polarization to all of said first through third regions; and a second writing step after said first writing step for causing reversal of said polarization in one of said first, second and third regions.

3. The ferroelectric memory device as claimed in claim 1, wherein said driver circuits carries out any of the operations of: (1) applying a writing voltage of a first polarity to said gate electrode and grounding said first and second diffusion regions and said semiconductor body; (2) applying a writing voltage of a second polarity to said gate electrode and grounding said first and second diffusion regions and said semiconductor body; (3) applying, after said step (1), said writing voltage of said second polarity to said gate electrode, said first and second diffusion regions and grounding said semiconductor body; (4) applying, after said step (2), said writing voltage of said first polarity to said gate electrode, floating said first and second diffusion regions, and grounding said semiconductor body; (5) applying, after said step (1), said writing voltage of said second polarity to said gate electrode, said first diffusion region and said semiconductor body and grounding said second diffusion region; (6) applying, after said step (1), said writing voltage of said second polarity to said gate electrode, said second diffusion region and said semiconductor body and grounding said first diffusion region; (7) applying, after said step (2), said writing voltage of said first polarity to said gate electrode and said semiconductor body, grounding said first diffusion region, and floating said second diffusion region; and (8) applying, after said step (2), said writing voltage of said first polarity to said gate electrode and said semiconductor body, floating said first the diffusion region and grounding said second diffusion region.

4. The ferroelectric memory device as claimed in claim 1, further comprising a reading circuit carrying out: a first reading step of detecting a first drain current by applying a read gate voltage to said gate electrode and applying a first read drain voltage to said first diffusion region; a second reading step of detecting a second drain current by applying a read gate voltage to said gate electrode and applying a second read drain voltage to said second diffusion region,
said ferroelectric memory device further comprising a data determination circuit determining a combination of polarizations induced respectively in said first, second and third regions from a combination of said first and second drain currents.

5. A semiconductor memory device, comprising:
a semiconductor body containing Si as a primary constituent element;
an insulation film formed on said semiconductor body in correspondence to a channel region in said semiconductor body;
a ferroelectric film formed on said insulation film;
a gate electrode formed on said ferroelectric film;
source and drain regions formed in said semiconductor body at respective lateral sides of said channel region,
wherein said insulation film comprises lamination of an amorphous film containing silicon oxide as a primary component and a polycrystal film containing HfO$_2$ as a primary component.

6. The ferroelectric memory device as claimed in claim 5, wherein said amorphous film has a film thickness of 2-5 nm.

7. The ferroelectric memory device as claimed in claim 5, wherein said polycrystal film comprises any of HfO$_2$, HfSiOx, HfAlOx and HfSiON.

8. The ferroelectric memory device as claimed in claim 5, wherein said ferroelectric film comprises a polycrystal film of any of Pb(Zr,Ti)O$_3$, SrBi$_2$Ta$_2$O$_9$, (Bi,La)$_4$Ti$_3$O$_{12}$, (Bi,Nd)$_4$Ti$_3$O$_{12}$, Bi$_4$Ti$_3$O$_{12}$ and Pb$_5$Ge$_3$O$_{11}$.

9. The ferroelectric memory device as claimed in claim 8, wherein said ferroelectric film is further doped with a trace element.

10. The ferroelectric memory device as claimed in claim 5, wherein said gate electrode comprises a laminated film including a conductive oxide film at an interface to said ferroelectric film.

11. The ferroelectric memory device as claimed in claim 10, wherein said conductive oxide film comprises any of IrO$_2$, RuO$_2$ and SrRuO$_3$.

* * * * *